US006822312B2

(12) United States Patent
Sowlati et al.

(10) Patent No.: US 6,822,312 B2
(45) Date of Patent: *Nov. 23, 2004

(54) INTERDIGITATED MULTILAYER CAPACITOR STRUCTURE FOR DEEP SUB-MICRON CMOS

(75) Inventors: Tirdad Sowlati, Ossining, NY (US); Vickram Vathulya, Ossining, NY (US)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/545,785

(22) Filed: Apr. 7, 2000

(65) Prior Publication Data

US 2002/0047154 A1 Apr. 25, 2002

(51) Int. Cl.[7] .................. H01L 29/00; H01L 27/108
(52) U.S. Cl. .................. 257/532; 257/306; 257/307; 257/311; 257/534
(58) Field of Search ................ 257/306–313, 257/532, 534, 535

(56) References Cited

U.S. PATENT DOCUMENTS

| | | | |
|---|---|---|---|
| 5,208,725 A | 5/1993 | Akeasu | 361/313 |
| 5,583,359 A * | 12/1996 | Ng et al. | 257/306 |
| 5,633,532 A | 5/1997 | Sohara et al. | 257/700 |
| 5,939,766 A | 8/1999 | Stolmeijer et al. | 257/534 |

FOREIGN PATENT DOCUMENTS

| | | | |
|---|---|---|---|
| EP | 0905792 A2 | 7/1998 | H01L/29/92 |
| EP | 0905792 A2 | 3/1999 | |
| EP | 1043740 A1 | 4/1999 | H01G/4/38 |
| JP | 58-51552 * | 3/1983 | H01L/27/04 |
| JP | 4268756 A | 9/1992 | |
| JP | 07283076 A | 10/1995 | |

OTHER PUBLICATIONS

Patent Abstracts of Japan, vol. 1996, No. 02, Feb. 29, 1996, JP 07283076 A.

* cited by examiner

*Primary Examiner*—Ori Nadav
(74) *Attorney, Agent, or Firm*—Peter Zawilski

(57) ABSTRACT

A capacitor structure having a first level of electrically conductive parallel lines and at least a second level of electrically conductive parallel lines disposed over the lines in the first level, the lines of the first and second levels being arranged in vertical rows. A dielectric layer is disposed between the first and second levels of conductive lines. One or more vias connect the first and second level lines in each of the rows, thereby forming a parallel array of vertical capacitor plates. Electrically opposing nodes form the terminals of the capacitor. The parallel array of vertical capacitor plates are electrically connected to the nodes in an alternating manner so that the plates have alternating electrical polarities.

19 Claims, 4 Drawing Sheets

US 6,822,312 B2

INTERDIGITATED MULTILAYER CAPACITOR STRUCTURE FOR DEEP SUB-MICRON CMOS

RELATED APPLICATIONS

Commonly-assigned, copending U.S. patent application, Ser. No. 09/542,711, entitled "Combined Transistor-Capacitor structure In Deep Sub-Micron CMOS For Power Amplifiers", filed Apr. 4, 2000.

Commonly-assigned, copending U.S. patent application, Ser. No. 09/596,443, entitled "Multilayer Pillar Array Capacitor Structure For Deep Sub-Micron CMOS", filed Jan 19, 2000.

Commonly-assigned, copending U.S. patent application, Ser. No. 09/546,125, entitled "Multilayered Capacitor Structure With Alternately Connected Concentric Lines For Deep Sub-Micron CMOS", filed Apr. 10, 2000.

Commonly-assigned, copending U.S. patent application, Ser. No. 09/542,712, entitled "Multilayer Capacitor Structure Having An Array Of Concentric Ring-Shaped Plates For Deep Sub-Micron CMOS", filed Apr. 4, 2000.

FIELD OF THE INVENTION

This invention relates to capacitor structures in metal-oxide-semiconductors (MOS), and in particular, to an interdigitated multilayer (IM) capacitor structure for deep sub-micron complementary MOS (CMOS), which is formed by interconnecting conductive lines in multiple levels through vias to construct a parallel array of vertical capacitor plates, and interconnecting the plates to the opposing nodes in an alternating manner so that the plates have alternating electrical polarities.

BACKGROUND OF THE INVENTION

Conventional capacitor structures for deep sub-micron CMOS are typically constructed with two flat parallel plates separated by a thin dielectric layer. The plates are formed by layers of conductive material, such as metal or polysilicon. The capacitor structure is usually isolated from the substrate by an underlying dielectric layer. To achieve high capacitance density in these devices, additional plates are provided. FIGS. 1A and 1B illustrate a representative conventional multi-parallel plate capacitor 10 in a deep sub-micron CMOS structure. The capacitor structure 10 includes a vertical stack of electrically conductive lines 12 separated by dielectric layers 13. The conductive lines 12 and dielectric layers 13 are constructed over a semiconductor substrate 11. The conductive lines 12 form the plates or electrodes of the capacitor 10. The plates 12 are electrically connected together in an alternating manner such that all the "A" plates are of a first polarity and all the "B" plates are of a second polarity, opposite to the first polarity.

A major limitation associated with parallel plate capacitor structures is that the minimum distance between the plates does not change as geometries in CMOS processes are scaled down. Hence, gains in capacitance density are not realized during such down scaling.

Various other capacitor structures with high capacitance densities, such as double polysilicon capacitors and gate-oxide capacitors, are known in the art. Double polysilicon capacitors, however, do not lend themselves to deep sub-micron CMOS processes. Gate-oxide capacitors are generally not used in deep sub-micron CMOS processes because they have large gate areas which cause yield and reliability issues, they generate capacitances which vary with voltage, and may experience high voltages that can breakdown the gate-oxide.

Trench capacitor structures for dynamic random access memories (DRAMs) have high capacitance densities. Such capacitors are formed by etching a trench in the substrate and filling the trench with conductive and dielectric material to form a vertical capacitance structure. However, trench capacitors are costly to fabricated because they add etching and trench filling processes.

Interdigitated capacitor structures are used in microwave applications. These capacitors have closely placed, interdigitated conductive line structures which produce fringing and cross-over capacitances therebetween to achieve capacitance. However, the cross-over capacitance produced by interdigitated capacitors is limited to a single conductor level.

Accordingly, a need exists for an improved capacitor structure for deep sub-micron CMOS, which takes advantage of shrinking semiconductor process geometries and can be manufactured inexpensively.

SUMMARY OF THE INVENTION

A capacitor structure comprising a first level of electrically conductive parallel lines and at least a second level of electrically conductive parallel lines disposed over the lines in the first level, the lines of the first and second levels being arranged in vertical rows. A dielectric layer is disposed between the first and second levels of conductive lines. One or more vias connect the first and second level lines in each of the rows, thereby forming a parallel array of vertical capacitor plates. Electrically opposing nodes form the terminals of the capacitor. The parallel array of vertical capacitor plates are electrically connected to the nodes in an alternating manner so that the plates have alternating electrical polarities.

BRIEF DESCRIPTION OF THE DRAWINGS

The advantages, nature, and various additional features of the invention will appear more fully upon consideration of the illustrative embodiments now to be described in detail in connection with accompanying drawings wherein.

It should be understood that the drawings are for purposes of illustrating the concepts of the invention and are not to scale.

DETAILED DESCRIPTION OF THE INVENTION

Figure 2A:
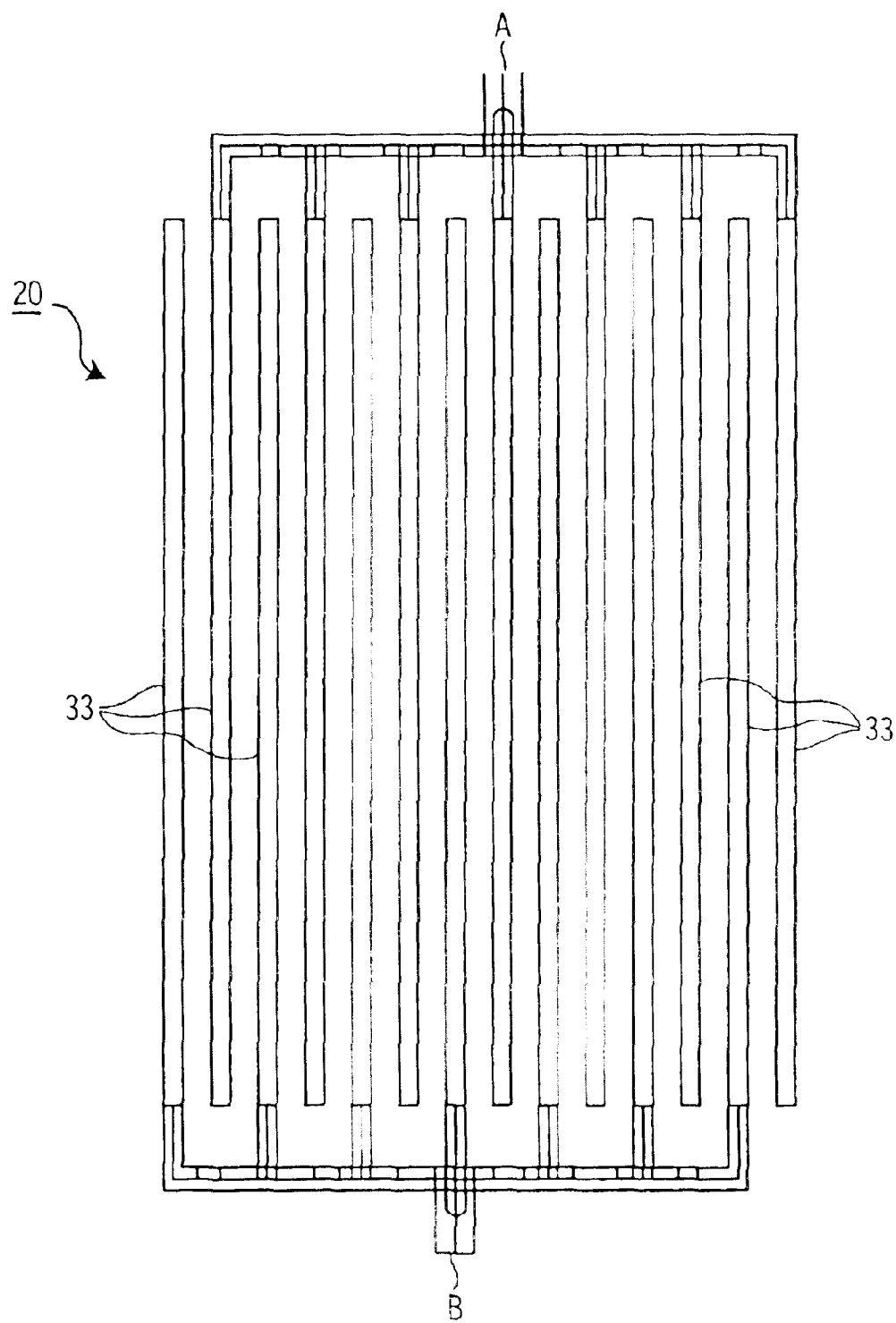
FIG. 2A is a top view of an interdigitated multilayer (IM) capacitor according to one embodiment of the invention in a deep sub-micron CMOS structure.
Figure 2B:
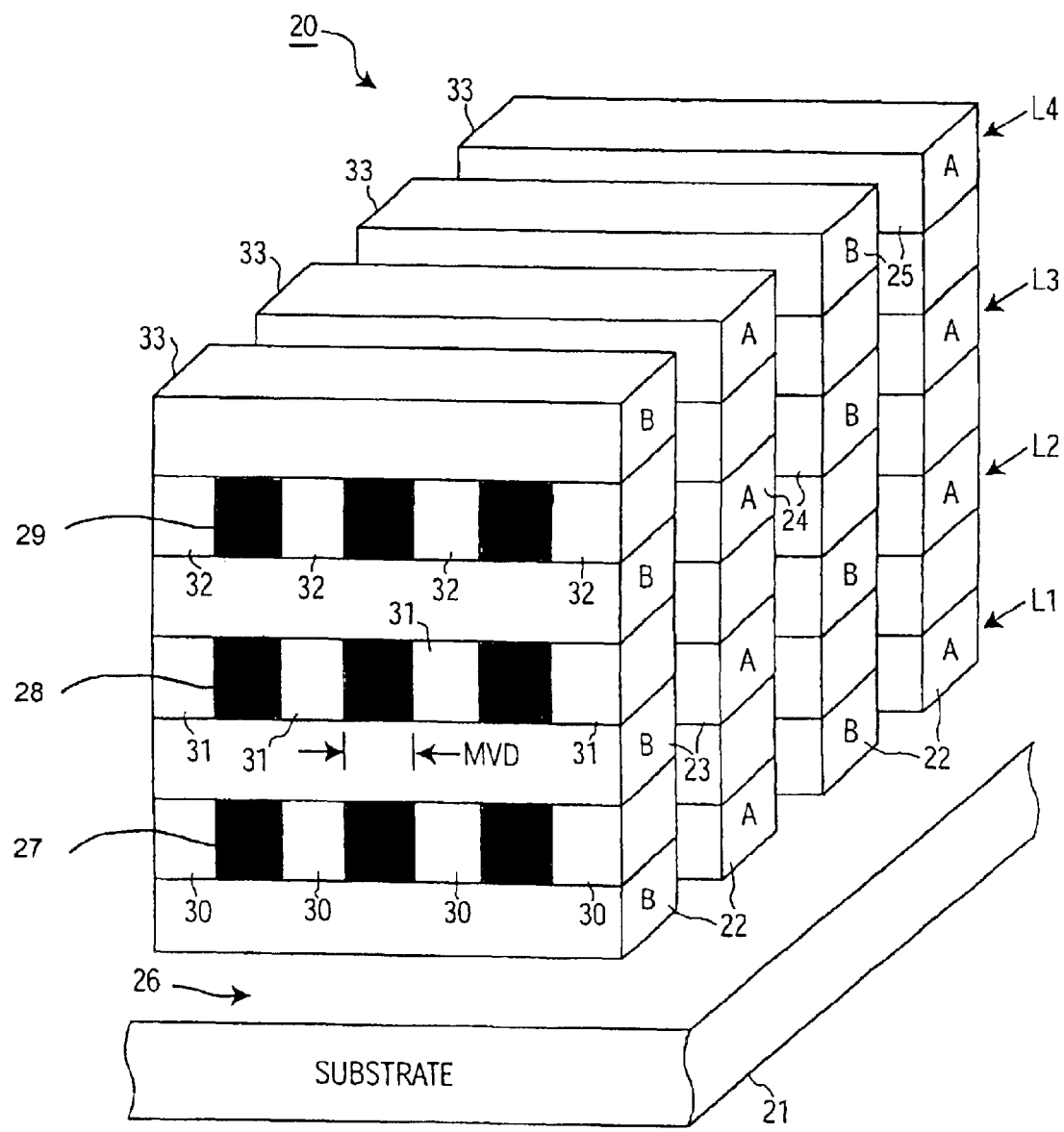
FIG. 2B is a perspective view of a section of the IM capacitor of FIG. 2A.
Figure 2C:
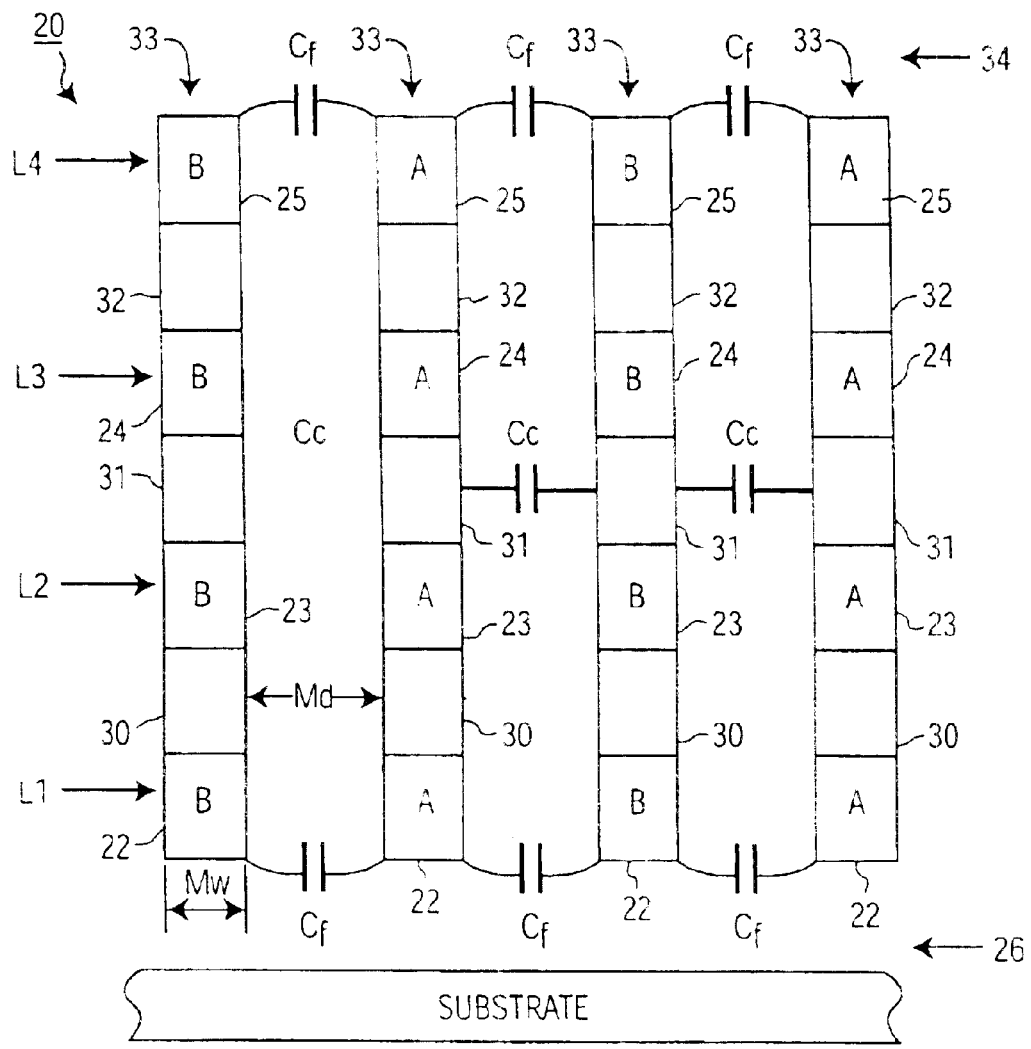
FIG. 2C is an end view of the IM capacitor section of FIG. 2B.

FIGS. 2A–2C illustrate an interdigitated multilayer (IM) capacitor structure 20 according to an embodiment of the invention for generating capacitance in deep sub-micron CMOS. The IM capacitor structure 20 is constructed over a substrate 21 of semiconductor material (FIGS. 2B and 2C)

in a multiple conductor level process (four electrical conductor levels L1–L4 are depicted for illustrative purposes only). The first conductor level L1 includes a first parallel array of electrically conductive horizontal lines 22, the second conductor level L2 includes a second parallel array of electrically conductive horizontal lines 23, the third conductor level L3 includes a third parallel array of electrically conductive horizontal lines 24, and the fourth conductor level L4 includes a fourth parallel array of electrically conductive horizontal lines 25. A first dielectric layer 26 fills the space between the substrate 21 and the first conductor level L1; a second dielectric layer 27 fills the space between the first and second conductor levels L1, L2 and the spaces between the lines 22 of the first conductor level L1; a third dielectric layer 28 fills the space between the second and third conductor levels L2, L3 and the spaces between the lines 23 of the second level L2; a fourth dielectric layer 29 fills the space between the third and fourth conductor levels L3, L4 and the spaces between the lines 24 of the third conductor level L3; and a fifth dielectric layer 34 fills the spaces between the lines 25 of the fourth conductor level L4.

The four levels L1–L4 of conductive lines 23–25 are aligned over each other in vertical in rows or stacks. The conductive lines 23–25 in each row are electrically interconnected through vertically extending electrically conductive vias 30–32 formed in the second, third, and fourth dielectric layers 27–29. The rows of conductive lines 23–25 and vias 30–32 form a parallel array of vertically extending plates 33 which form the electrodes of the capacitor structure 20. The vertical plates 33 are electrically interdigitated into "A" and "B" plates of opposite polarity by electrically connecting the top or bottom of the A plates to a first common node A and electrically connecting the top or bottom of the B plates to a second common node B (FIG. 2A). The first and second nodes A, B form the terminals of the IM capacitor structure 20.

Figure 3:
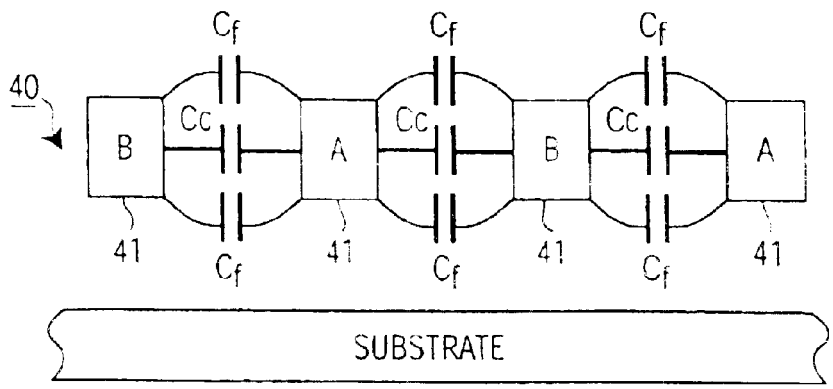
FIG. 3 is an end view of a conventional interdigitated capacitor.

The mechanism by which the IM capacitor structure 20 of the present invention generates capacitance can be best understood by first examining a conventional single level interdigitated capacitor structure 40 as shown in FIG. 3. The interdigitated capacitor structure 40 has a total capacitance $C_{Total}$ which is the sum of all the cross-over capacitance $C_c$ between the interdigitated conductive lines 41 and all the fringing capacitance $C_f$ between the interdigitated conductive lines 41. In the interdigitated capacitor structure 40, the fringing capacitance $C_f$ is comparable in quantity to the cross-over capacitance $C_c$.

The IM capacitor structure 20 of the invention also has a total capacitance $C_{Total}$ which is the sum of all the cross-over capacitance $C_c$ between the interdigitated vertical plates 33 (the sum of the cross-over capacitance between adjacent conductive lines and the cross-over capacitance between adjacent vias) and all the fringing capacitance $C_f$ between the interdigitated vertical plates 33. However, unlike the conventional interdigitated capacitor structure 40, the quantity of cross-over capacitance $C_c$ increases with each additional conductor level in the IM capacitor structure 20 while the quantity of fringing capacitance $C_f$ does not change. Hence, the fringing capacitance in the IM capacitor structure 20 contributes less to its total capacitance $C_{Total}$. As additional conductor levels are used in the IM capacitor structure 20, the quantity of cross-over capacitance $C_c$ becomes a dominant factor in the capacitor's total capacitance $C_{Total}$, while the quantity of fringing capacitance $C_f$ becomes much less significant.

In present state-of-the-art deep sub-micron CMOS technology, conductive line spacings of about 0.5 microns or less is common. Thus, the minimum distance between the vertical plates of the IM capacitor structure 20 of the invention is typically equal to or less than about 0.5 microns. (The height of the plates is typically greater than about 5 microns when stacking four levels of conductive lines.) The sub-micron spacings between the vertical plates 33 of the IM capacitor structure 20 of the invention provide it with increased capacitance density as compared to what can be achieved using conventional parallel plate capacitor structures.

Figure 1A:
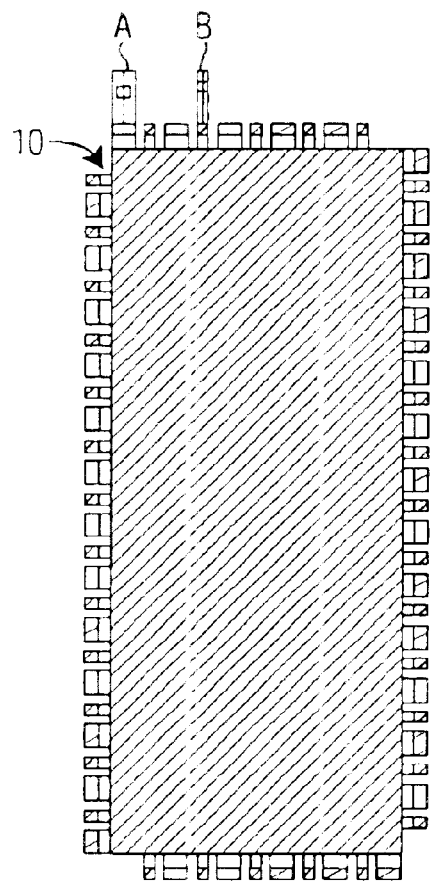
FIG. 1A is a top view of a conventional parallel plate capacitor structure in a deep sub-micron integrated circuit structure.
Figure 1B:
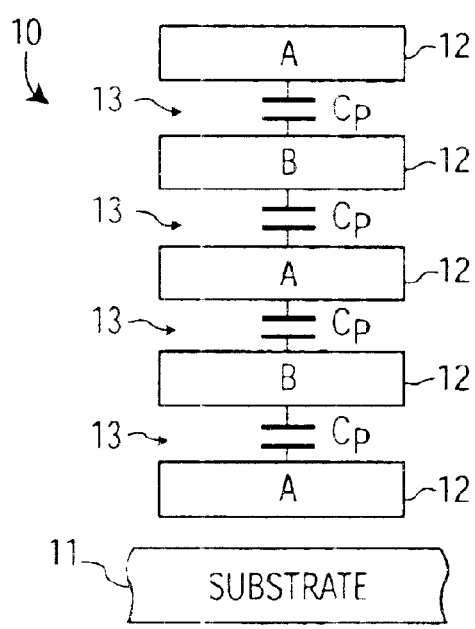
FIG. 1B is a cross-sectional view through line 1B—1B of FIG. 1A.

The improvement in capacitance density can be seen by comparing the capacitance of a conventional parallel plate capacitor, similar to the one shown in FIGS. 1A and 1B, constructed with five (5) plates and having dimensions of 15 microns×39 microns, with a capacitor constructed with 4 conductor levels according to the invention (FIG. 2A) and having dimensions of 14.9 microns×39 microns. Both capacitors were constructed in a 0.25 micron CMOS process. The parallel plate capacitance between nodes A and B of the parallel plate capacitor was found to be 95 fF, compared to the cross-over capacitance between nodes A and B of the IM capacitor which was found to be 150 fF. Hence, the IM capacitor structure of the present invention provides an increase of about 60 percent in capacitance density.

As the geometries in semiconductor process technologies continue to shrink and scale down, the capacitance density of the IM capacitor structure 20 of the invention will advantageously increase. This is because the minimum width $M_w$ of the conductive lines 22–25 (FIG. 2C), the dimensions of the vias 30–32, the minimum distance $M_{dv}$ between the vias 30–32 in the same vertical plate (FIG. 2B), and the minimum distance $M_d$ between vertical plates 33 (FIG. 2C) of the IM capacitor structure 20 of the invention will advantageously decrease. As a result, the cross-over capacitance $C_c$ of the IM capacitor structure 20 will increase. Such capacitance increases are not possible in conventional multilayer parallel plate capacitor structures because the heights or thicknesses of the conductor and dielectric levels do not scale down. Hence, the distance between the plates will remain about 1 micron in conventional parallel plate capacitor structures.

The IM capacitor structure of the invention is typically manufactured in silicon using conventional deep sub-micron CMOS processing. The capacitor structure of the invention can also be manufactured in gallium arsenide or any other suitable semiconductor system using conventional deep sub-micron processing. Manufacturing in silicon using deep sub-micron CMOS processing, usually involves growing or depositing a first layer of silicon dioxide on a selected portion of the silicon semiconductor substrate to form the first dielectric layer. The silicon dioxide layer has a thickness in the range of about one micron. A first layer of metal, such as aluminum, or highly conductive polysilicon, is deposited on the first dielectric layer of silicon dioxide and then defined into the conductive lines using well known masking and dry etching techniques to form the first conductor level. As mentioned above, the width and spacing of the conductive lines are set to the minimum dimensions of the process to enhance the capacitance of the structure, i.e., the lines and spacing between the lines are as narrow as possible.

A second layer of silicon dioxide is then grown or deposited over the conductive lines to form the second dielectric layer. The thickness of the second dielectric layer of silicon dioxide is in the range of about one micron. A plurality of holes, which extend down to the first conductor level are defined in the second dielectric layer of silicon dioxide and then filled with metal or polysilicon using conventional via fabrication techniques to form the vertically extending vias in the second dielectric layer. A second layer of metal, such as aluminum, or polysilicon, is deposited on the second dielectric layer of silicon dioxide and then defined into the conductive lines of the second conductor level. The remaining dielectric layers, vias, conductor levels, and conductive lines are fabricated in the same manner as described above.

One of ordinary skill in the art will recognized that specialized dielectric materials can be used in place of silicon dioxide (silicon systems) or silicon nitride (galium arsenide systems) to form the dielectric layers. For example a ferro-electric ceramic, such as PLZT (lanthanum-modified lead zirconate tantalate) can be used to form the dielectric layers. The use of PLZT layers greatly enhances capacitance as PLZT has a dielectric constant of approximately 4,700, in contrast to 3.9 for the dielectric constant of silicon dioxide.

The ordinary skill artisan will further recognize that the IM capacitor structure of the invention can be useful in many applications, such as RF, analog and digital applications. RF circuit applications employ capacitors for matching. The larger the capacitance per unit area, the smaller the area and the lower the cost. In analog circuit applications, undesirable noise can often be reduced by using large capacitors (KT/C). In digital circuit applications, large decoupling capacitances are often very important and can be easily provided with the capacitor of the invention.

While the foregoing invention has been described with reference to the above embodiments, additional modifications and changes can be made without departing from the spirit of the invention. Accordingly, all such modifications and changes are considered to be within the scope of the appended claims.

What is claimed is:

1. A capacitor comprising:
   a first level of at least four electrically conductive parallel lines extending in a first direction and lying in a first plane, the first plane disposed above a substrate;
   at least a second level of at least four electrically conductive parallel lines extending in the first direction and lying in a second plane above the first plane, each of the second level lines being disposed over a respective one of the first level lines, such that the lines of the first and second levels are arranged in a series of at least four coplanar line pairs, each line pair comprising one of the first level lines and a respective one of the second level lines, the coplanar line pairs being substantially parallel to, and extending vertically upward from the substrate;
   a dielectric layer disposed between the first and second levels of conductive lines;
   a plurality of vias arranged in a plurality of groups, each group corresponding uniquely to one of the coplanar line pairs and each group including at least two vias connecting the first level line and the second level line of the corresponding line pair, thereby forming an array of at least four vertically oriented parallel capacitor plates, the vertically oriented parallel plates being spaced apart from each other, and only dielectric material being disposed between each of the vertically oriented parallel plates; and
   electrically opposing nodes forming the terminals of the capacitor, the array of vertically oriented parallel capacitor plates electrically connected to the opposing nodes in an alternating manner so that the vertically oriented parallel capacitor plates have alternating electrical polarities;
   wherein each vertically oriented parallel capacitor plate comprises a mesh structure.

2. The capacitor of claim 1, wherein the conductive lines comprise metal.

3. The capacitor of claim 1, wherein the conductive lines comprise polysilicon.

4. The capacitor of claim 1, wherein the dielectric layer comprises silicon dioxide.

5. The capacitor of claim 1, further comprising:
   at least a third level of electrically conductive parallel lines extending in the first direction and lying in a third plane above the first and second planes such that each of the third level lines is coplanar with a respective one of said line pairs; and
   a second dielectric layer disposed between the second and third levels of conductive lines,
   so that the third level of lines vertically extends the array of at least four parallel capacitor plates.

6. The capacitor of claim 1, wherein the first and the at least second multiple levels of electrically conductive parallel lines comprise a plurality of electrically conductive parallel lines arranged in vertical plates, and the dielectric layer comprises a plurality of dielectric layers, each of the layers disposed between opposing levels of conductive lines.

7. The capacitor of claim 1, wherein the substrate is made from a semiconductor material.

8. The capacitor of claim 1, wherein the capacitor comprises a sub-micron MOS structure.

9. The capacitor of claim 1, wherein the capacitor comprises a sub-micron structure.

10. The capacitor of claim 1, wherein each respective plurality of vias of the at least four line pairs of the at least four parallel capacitor plates is arranged opposite a next said respective plurality of vias, with identical spacing of vias in each plurality of vias.

11. A capacitor comprising:
    a first level of at least four electrically conductive parallel lines extending in a first direction above a substrate;
    at least a second level of at least four electrically conductive parallel lines extending in the first direction and lying above the first level, each of the second level lines being disposed over a corresponding one of the first level lines, such that the lines of the first and second levels are arranged in a series of at least four line pairs, each line pair comprising one of the first level lines and the corresponding one of the second level lines disposed thereover;
    a dielectric layer disposed between the first and second levels of conductive lines;
    a plurality of groups of vias, each group corresponding to one of the line pairs and each group including a plurality of vias directly connecting the first level line and the second level line of the corresponding line pair, thereby forming an array of at least four parallel vertically oriented mesh structures, each mesh structure having dielectric filled openings therein and only the dielectric is disposed between the vertically oriented mesh structures; and
    electrically opposing nodes forming the terminals of the capacitor, the array of parallel vertically oriented mesh structures electrically connected to the opposing nodes in an alternating manner so that the vertically oriented mesh structures have alternating electrical polarities.

12. The capacitor of claim 11, further comprising:
    at least a third level of electrically conductive parallel lines extending in the first direction and lying above the first and second levels such that each of the third level lines is disposed over a corresponding one of said line pairs; and a second dielectric layer disposed between the second and third levels of conductive lines, wherein the third level of lines vertically extends the array of at least four parallel vertically oriented mesh structures.

13. The capacitor of claim 11, wherein the vias in each group are identically spaced apart.

14. The capacitor of claim 11, wherein each group includes tour vias.

15. The capacitor of claim 11, wherein each group includes:

a first via directly connecting the first level line and the second level line of the corresponding line pair at respective first ends of the first and second level lines; and a second via directly connecting the first level line and the second level line of the corresponding line pair at respective second ends of the first and second level lines, wherein the second ends are opposite the first ends along the first direction.

16. A capacitor comprising:

a first level of at least four electrically conductive parallel lines extending in a first direction;

at least a second level of at least four electrically conductive parallel lines extending in the first direction and lying above the first level, each of the second level lines being disposed over a corresponding one of the first level lines, such that the lines of the first and second levels are arranged in a series of at least four line pairs, each line pair comprising one of the first level lines and the corresponding one of the second level lines disposed thereover;

a dielectric layer disposed between portions of the first and second levels of conductive lines, disposed on the first level adjacent the parallel lines of the first level, and further disposed on the second level adjacent the parallel lines of the second level;

a plurality of groups of vias, each group including a plurality of vias extending directly between the first level line and the second level line of a line pair, thereby forming an array of at least four parallel capacitor plate structures, the plate structures being spaced apart from each other, and only the dielectric being disposed between each of the plate structures; and electrically opposing nodes forming the terminals of the capacitor, the array of parallel capacitor plates electrically connected to the opposing nodes in an alternating manner so that the plates have alternating electrical polarities;

wherein each parallel capacitor plate structure comprises a mesh structure.

17. The capacitor of claim 16, further comprising:

at least a third level of electrically conductive parallel lines extending in the first direction and lying above the first and second levels such that each of the third level lines is disposed over a corresponding one of said line pairs; and a second dielectric layer disposed between portions of the second and third levels of conductive lines disposed on the third level adjacent the parallel lines of the third level, wherein the third level of lines vertically extends the array of at least four parallel capacitor plate structures.

18. The capacitor of claim 16, wherein each group includes four vias.

19. The capacitor of claim 17, wherein each of the at least four plate structures have dielectric disposed in the openings of the mesh, the plate structures extend vertically upward from a substrate and are perpendicular to the substrate.

* * * * *